United States Patent [19]

Hirano

[11] Patent Number: 4,637,845
[45] Date of Patent: Jan. 20, 1987

[54] METHOD OF MANUFACTURING SEMICONDUCTOR LIGHT EMITTING DEVICE

[75] Inventor: Ryoichi Hirano, Itami, Japan

[73] Assignee: Mitsubishi Denki Kabushiki Kaisha, Japan

[21] Appl. No.: 664,880

[22] Filed: Oct. 25, 1984

[30] Foreign Application Priority Data

Nov. 9, 1983 [JP] Japan .............................. 58-211952

[51] Int. Cl.$^4$ .................... H01L 21/208; H01L 21/225
[52] U.S. Cl. .................................... 148/171; 148/172; 148/190; 29/569 L
[58] Field of Search ........................ 148/171, 172, 190; 29/569 L, 576 E

[56] References Cited

U.S. PATENT DOCUMENTS

| | | | |
|---|---|---|---|
| 4,033,796 | 7/1977 | Burnham et al. | 148/171 X |
| 4,251,298 | 2/1981 | Thompson | 148/171 |
| 4,287,485 | 9/1981 | Hsieh | 148/172 X |
| 4,321,556 | 3/1982 | Sakuma | 148/171 X |
| 4,366,568 | 12/1982 | Shimizu et al. | 148/172 X |
| 4,509,996 | 4/1985 | Greene et al. | 148/171 |
| 4,536,940 | 8/1985 | Henry et al. | 148/172 X |

OTHER PUBLICATIONS

Murotani et al., "InGaAsP/InP Buried Crescent Laser Emitting at 1.3 μm with Very Low Threshold Current", *Electronics Letters*, vol. 16, No. 14, Jul. 3, 1980, pp. 566–568.
"Position of the Degradation and the Improved Structure for the Buried Crescent InGaAsP/InP (1.3 μm) lasers, Hirano et al., App. Phys. Lett., 43(2), Jul. 15, 1983, pp. 187–189.
"Formation of a Long-Wavelength Buried-Crescent Laser Structure on Channelled Substrates", by D. L. Murrell et al., IEE Proc., vol. 129, Pt. 1, No. 6, Dec. 1982, pp. 209–213.
"Single-Mode Lasers for Optical Communications", by D. Botez, IEE Proc., vol. 129, Pt. 1, No. 6, Dec. 1982, pp. 237–251.
"V-Grooved-Substrate Buried Heterostructure In- GaAsP/InP Laser Diodes", by Hajime Imai et al., Fujitsu Sci. Tech. J., 18, 4, Dec. 1982, pp. 541–561.
"Integrated Arrays of 1.3-μm Buried-Crescent Lasers", by H. Temkin et al., Appl. Phys. Lett. 42(11), Jun. 1, 1983, pp. 934–936.
"High-power, single-mode operation of an InGaAsP- /InP laser with a grooved transverse junction using gain stabilization", by T. R. Chen et al., Appl. Phys. Lett. 41(3), 1 Aug. 1982, pp. 225–228.
"VPE-Grown 1.3 μm InGaAsP/InP Double-Channel Planar Buried-Heterostructure Laser Diode with LPE-Burying Layers", by Tomoo Yanase et al., Japanese Journal of Applied Physics, vol. 22, No. 7, Jul. 1983, pp. L415–L416.
"V-Grooved Substrate Buried Heterostructure In- GaAsP/InP Laser", by H. Ishikawa et al., Electronics Letters, vol. 17, No. 13, Jun. 25, 1981, pp. 465–467.

*Primary Examiner*—George T. Ozaki
*Attorney, Agent, or Firm*—Lowe, Price, LeBlanc, Becker & Shur

[57] ABSTRACT

A method of manufacturing a semiconductor light emitting device comprises the steps of: forming a p-InP first semiconductor layer (11) on a p-type semiconductor substrate (10) by a first growth or diffusion; forming a groove (15) shaped like a stripe in the substrate and the first semiconductor layer; and successively forming a p-InP second semiconductor layer (12), a p or n- InGaAsP third semiconductor layer (13) and an n-InP fourth semiconductor layer (14) in the regions including the inner and outer portions of the grooves by the second growth. In this manufacturing method, the carrier concentration of the p-type impurity in the first semiconductor layer is selected to be higher than the carrier concentration in the fourth semiconductor layer. As a result, by the growth process of the respective semiconductor layers in the inner and outer portions of the groove or by the heat treatment after a growth process, the impurity can be diffused from the first semiconductor layer into the fourth semiconductor layer and the p-n junction faces can be moved from the inner surfaces of the groove into the fourth semiconductor layer.

8 Claims, 12 Drawing Figures

METHOD OF MANUFACTURING SEMICONDUCTOR LIGHT EMITTING DEVICE

BACKGROUND OF THE INVENTION

1. Field of the Invention

The present invention relates to a method of manufacturing a semiconductor light emitting device. More particularly, the present invention relates to a method of manufacturing a semiconductor light emitting device having high reliability even at a high temperature such as in case of a semiconductor laser.

2. Description of the Prior Art

The inventors of the present application found, as a result of recent studies, that one of the important conditions for obtaining semiconductor light emitting device having high reliability at high temperature is that such an interface as described below must not be formed. More specifically, if a grown layer is provided on a surface exposed to a high temperature atmosphere to form a p-n junction in the crystal interface, a semiconductor light emitting device having such an interface (referred to hereinafter as the exposed p-n junction interface) is in a state where the forward direction voltage in the exposed p-n junction interface is gradually lowered (deteriorated) when forward current is supplied in this junction. It was ascertained that such deterioration becomes more excessive according to the elevation of the conduction temperature or the increase of the current density in conduction. Based on this fact, the inventors of the present application issued a paper in the Applied Physics Letters 43 (2), 15, pages 187 to 189 (issued in July, 1983) concening a deteriorated position of an n substrate BC (buried crecent) laser and an improved structure thereof. This paper proposed a structure of a BC type semiconductor laser in which the exposed surface and the p-n junction interface are separated.

Now, description will be made of a structure of a semiconductor light emitting device called a BC type semiconductor laser and the manufacturing process thereof, with reference to FIGS. 1, 2A to 2C, 3A and 3B.

First, referring to FIG. 1, a BC type semiconductor laser comprises a p-side electrode 1, an n-side electrode 2, an n-InP substrate 3, a P-InP layer 4, an n-InP clad layers 5 and 5a, an n or p-InGaAsP active layers 6 and 6a and a p-InP clad layer 7. The BC type semiconductor is manufactured by the process shown in FIGS. 2(A) to 2(C). More specifically, as shown in FIG. 2(A), a p-InP layer 4 is formed on a semiconductor substrate 3 by the first growth or diffusion. Then, as shown in FIG. 2(B), a groove 8 shaped like a stripe is formed in the substrate 3 and the p-InP layer 4. After that, as shown in FIG. 2(C), an n-InP clad layer 5, an n or p-InGaAsp layer 6 and a p-InP clad layer 7 are formed successively by second growth in the regions covering the inner and outer portions of the groove 8.

In this case, referring to FIGS. 3(A) and 3(B), assuming that the carrier concentration of the p-type impurity in the p-InP clad layer 7 is Np and that the carrier concentration of the n-type impurity in the n-InP clad layer 5 is Nn, the values of Np and Nn are set to satisfy the condition of Np>Nn. As the p-type impurity, Zn, for example, is selected for the purpose of facilitating the diffusion. Under these conditions, at the time of growth of the p-InP clad layer 7 in the inner and outer portions of the groove 8 or by the heat treatment after the growth, diffusion of the impurity is caused so that the positions A, B, C and D of the p-n junction interfaces initially exposed to the atmosphere shown in FIG. 3(A) can be moved to the positions A', B', C' and D' in the n-InP clad layer 5 as shown in FIG. 3(B).

By moving the p-n junctions from the exposed interfaces by the diffusion as described above, such exposed p-n junction interfaces recognized as a factor of deterioration of the electric characteristics at the time of operation at high temperature are made to disappear. As a result, by such movement of the interfaces, continuous oscillation can be applied at a high temperature, say 80° C., though conventionally it was difficult to apply continuous oscillation at a temperature higher than 60° C. However, through a closer examination of the oscillation characteristics at high temperature, it was made clear that deterioration of the characteristics cannot be perfectly prevented.

Specifically stated, when a constant light output operation experiment was performed for several thousands of hours with the conditions of 80° C. and light output of one surface of 5 mW, increase of the oscillation threshold current, namely, deterioration was found. Upon investigation of the cause of such deterioration, it was made clear that dotted (linear in the depth direction) deteriorated portions at the intersection between the exposed interfaces and the moved p-n junction interfaces exist in the portions shown by the points X in FIG. 3(B) and that leakage of current occurs in those portions.

SUMMARY OF THE INVENTION

Therefore, a primary object of the present invention is to provide a method of manufacturing a semiconductor light emitting device in which deterioration of the device can be prevented with a structure where an exposed interface and a moved p-n junction interface do not intersect with each other.

Briefly stated, in the present invention, first a semiconductor substrate of a first conductive type is provided and a groove shaped like a stripe is formed in the semiconductor substrate and then, a first semiconductor layer of the first conductive type, a second semiconductor layer of a second or first conductive type and a third semiconductor layer of the second conductive type are successively formed in the regions including the inner and outer portions of the groove. Then, by the growth process of the respective semiconductor layers in the inner and outer portions of the groove or by the heat treatment applied thereto after the growth process, the impurity of the first conductive type is diffused from the semiconductor substrate into the third semiconductor layer, so that the p-n junction interfaces can be moved from the inner surfaces of the groove into the third semiconductor layer by this diffusion.

Therefore, according to the present invention, since the p-n junctions are moved from the exposed interfaces by the diffusion at the time of the heat treatment, the electric characteristics of a device will not be deteriorated even by the conduction for many hours at high temperature and thus a semiconductor light emitting device having excellent performance can be obtained.

In a preferred embodiment of the present invention, the carrier concentration of the impurity in a semiconductor substrate of the first conductive type is higher than the concentration of the impurity of the second conductive type in the third semiconductor layer, and as the impurity of the first conductive type, Zn is utilized.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
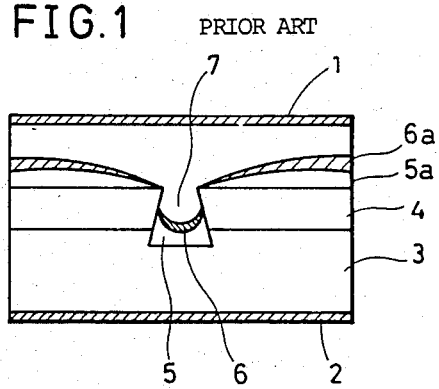
FIG. 1 is a sectional view showing the structure of a conventional BC type semiconductor light emitting device.
Figure 2A:
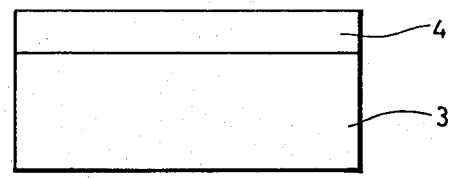
FIGS. 2A to 2C are sectional views showing a manufacturing process of a conventional BC type semiconductor light emitting device.
Figure 2B:
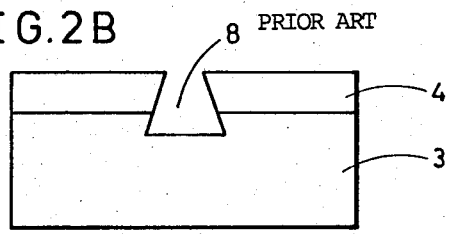
Figure 2C:
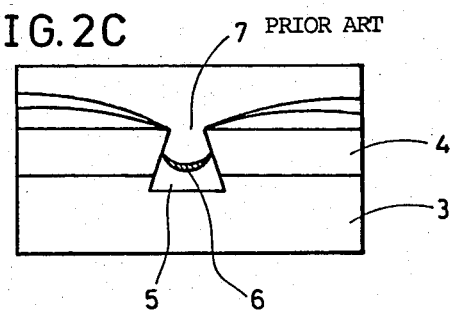
Figure 3A:
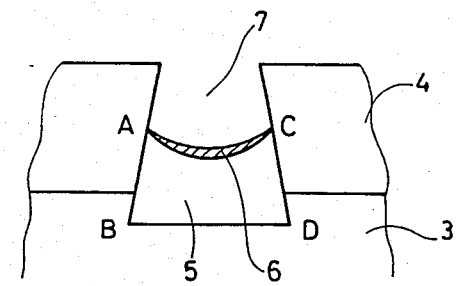
FIGS. 3A and 3B are sectional views showing an enlarged essential portion of the conventional BC type semiconductor light emitting device showing in FIG. 1.
Figure 3B:
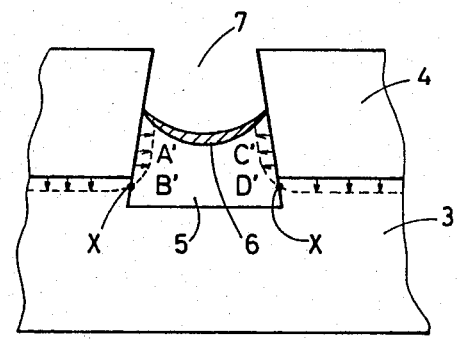
Figure 4:
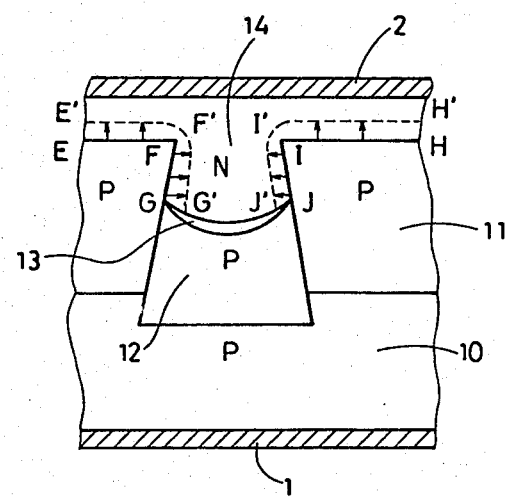
FIG. 4 is a sectional view showing an essential portion of an embodiment of the present invention.
Figure 5A:
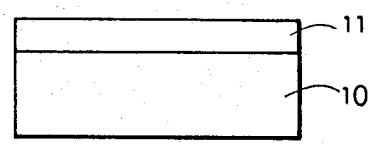
FIGS. 5A to 5C are sectional views showing a manufacturing process of an embodiment of the present invention.
Figure 5B:
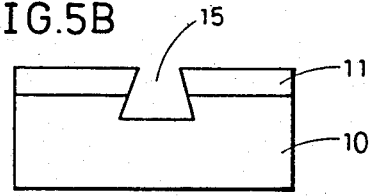
Figure 5C:
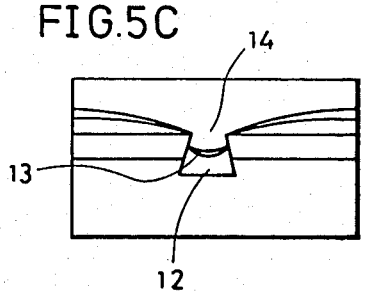

FIG. 4 is a sectional view showing the structure of an embodiment of the present invention and FIGS. 5A to 5C are sectional views showing a manufacturing process of an embodiment of the present invention.

First, referring to FIG. 4, the structure of an embodiment of the present invention will be described. A semiconductor light emitting device in accordance with an embodiment of the present invention comprises: a p-side electrode 1; an n-side electrode 2; a p-InP substrate 10 of a first conductive type; a p-InP layer 11; a p-InP clad layer 12 as a first semiconductor layer; p or n-InGaAsP active layer 13 as a second semiconductor layer; and an n-InP clad layer 14 as a third semiconductor layer.

The semiconductor light emitting device shown in FIG. 4 is manufactured according to the manufacturing process shown in FIGS. 5A to 5C. More specifically, first, as shown in FIG. 5(A), a p-InP layer 11 is formed on the substrate 10 by the first growth or diffusion (or using the substrate itself). Then, as shown in FIG. 5(B), a groove 15 shaped like a stripe is formed in the substrate 10 and the p-InP layer 11. Subsequently, as shown in FIG. 5(c), a p-InP clad layer 12, a p or n-InGaAsP layer 13 and an n-InP clad layer 14 are successively formed in the regions including the inner and outer portions of the groove 15 by the second growth.

In this manufacturing process, assuming that the carrier concentration of the p-type impurity in the p-InP layer 11 is Np and that the carrier concentration of the n-type impurty in the n-InP clad layer 14 is Nn, the values of Np and Nn are set to be Np>Nn, whereby the respective layers 12, 13 and 14 are formed in the inner and outer portions of the groove 15. In addition, as the p-type impurity, Zn is selected so that the diffusion may be made easy. Under these conditions, at the time of growth of the n-InP clad layer 14 in the inner and outer portions of the groove 15, or by the diffusion caused by the heat treatment after the growth, the positions E-F-G and H-I-J of the initially exposed p-n junction interfaces can be moved respectively to the positions E'-F'-G' and H'-I'-J' in the n-InP layer 14, as shown in FIG. 4.

By thus moving the p-n junctions from the exposed interfaces by the diffusion, the portions of intersection between the exposed interfaces and the p-n junction interfaces, recognized as a cause of deterioration during high temperature operation disappear. As a result, in this embodiment, electric current can be collected to the p or n-InGaAsP layer 13 serving as an active region and consequently, the electric characteristics inherent to the device can be maintained without being damaged by the conduction for many hours at high temperature.

Figure 6:
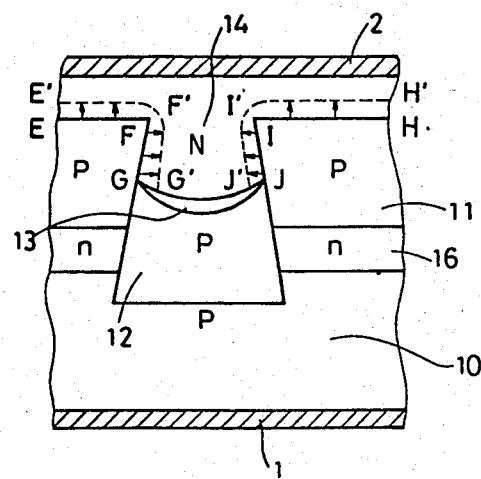
FIG. 6 is a sectional view showing an essential portion of another embodiment of the present invention.

FIG. 6 is a sectional view showing an essential portion of another embodiment of the present invention. In the embodiment shown in FIG. 6, an n-InP layer 16 is formed on the p-InP substrate 10 and the p-InP layer 11 is formed on the n-InP layer 16, so that the groove 15 shaped like a stripe is formed in the p-InP substrate 10, the n-InP layer 16 and the p-InP layer 11. The remaining structure of FIG. 6 is the same as in the embodiment shown in FIGS. 4 and 5.

Figure 7:
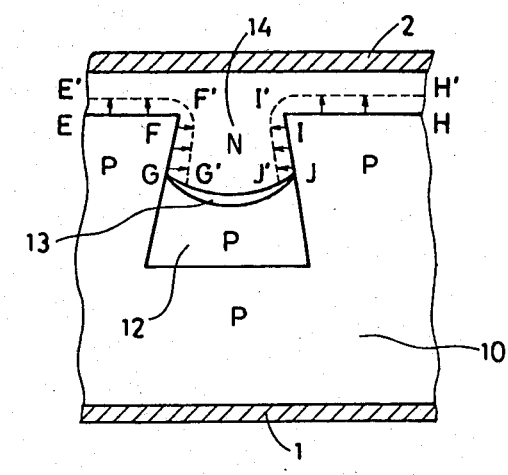
FIG. 7 is a sectional view showing an essential portion of another embodiment of the present invention.

FIG. 7 is a sectional view showing an essential portion of another embodiment of the present invention. In the embodiment show in FIG. 7 the groove 15 shaped like a stripe is formed in the p-InP substrate 10. The remaining structure of FIG. 7 is the same as in the embodiment shown in FIGS. 4 and 5.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor light emitting device wherein an exposed surface and a p-n junction displaced therefrom are in a non-intersecting relationship comprising the steps of:

providing a semiconductor substrate (10, 11) having a surface layer of a first conductivity type, forming a stripe shaped groove (15) in said semiconductor substrate of said first conductivity type, forming successively a first semiconductor layer (12) of said first conductivity type and a second semiconductor layer (13) of either conductivity type in regions including the inner portion of said groove, and then forming a third semiconductor layer (14) of said second conductivity type on said second semiconductor layer and in regions inside and outside said groove, said third semiconductor layer being directly grown on said surface layer of the substrate and forming a p-n junction interface therein, and diffusing the impurity of said first conductivity type from said surface layer of the semiconductor substrate into said third semiconductor layer by the growth process of the respective semiconductor layers inside and outside said groove, so that the p-n junction interface moves from the inner surfaces of said groove and said surface layer into said third semiconductor layer.

2. A method of manufacturing a semiconductor light emitting device in accordance with claim 1, wherein the impurity of said first conductive type is Zn.

3. A method of manufacturing a semiconductor light emitting device in accordance with claim 1, wherein said step of providing a semiconductor substrate having a surface layer comprises the step of duffusing an impurity of said first conductivity type.

4. A method of manufacturing a semiconductor light emitting device in accordance with claim 1, comprising the further step of forming an underlayer of said surface layer of the substrate of said second conductivity type.

5. A method of manufacturing a semiconductor light emitting device in accordance with claim 1, wherein said step of forming the second semiconductor layer comprises forming said second semiconductor layer of InGaAsP and the steps of forming the other semiconductor layers comprises forming said layers of 6. A method of manufacturing a semiconductor light emitting device wherein a grooved surface and a p-n junction displaced therefrom are in a non-intersecting relationship comprising the steps of:
   providing a semiconductor substrate of a first conductivity type,
   forming a stripe shaped groove (15) in said semiconductor substrate of said first conductivity type,
   forming successively a first semiconductor layer (12) of said first conductivity type and a second semiconductor layer (13) of either conductivity type in regions including the inner portion of said groove, and then forming a third semiconductor layer (14) of said second conductivity type on said second semiconductor layer and in regions inside and outside said groove, said third semiconductor layer being directly grown on said substrate and forming a p-n junction interface therein, and
   diffusing the impurity of said first conductivity type from said semiconductor substrate into said third semiconductor layer by the growth process of the respective semiconductor layers inside and outside said groove so that the p-n junction interface moves from the inner surfaces of said groove and said surface layer into said third semiconductor layer.

7. A method of manufacturing a semiconductor light emitting device wherein a grooved surface and a p-n junction displaced therefrom are in a non-intersecting relationship comprising the steps of:
   providing a semiconductor substrate (10, 11) having a surface layer of a first conductivity type,
   forming a stripe shaped groove (15) in said semiconductor substrate of said first conductivity type,
   forming successively a first semiconductor layer (12) of said first conductivity type and a second semiconductor layer (13) of either conductivity type in regions including the inner portion of said groove, and then forming a third semiconductor layer (14) of said second conductivity type on said second semiconductor layer and in regions inside and outside said groove, said third semiconductor layer being directly grown on said surface layer of the substrate and forming a p-n junction interface therein, and
   diffusing the impurity of said first conductivity type from said surface layer of the semiconductor substrate into said third semiconductor layer by a heat treatment after the growth process of the respective semiconductor layers inside and outside said groove so that the p-n junction interface moves from the inner surfaces of said groove and said surface layer into said third semiconductor layer.

8. A method of manufacturing a semiconductor light emitting device wherein an exposed surface and a p-n junction displaced therefrom are in a non-intersecting relationship comprising the steps of:
   providing a semiconductor substrate (10, 11) having a surface layer of a first conductivity type,
   forming a stripe shaped groove (15) in said semiconductor substrate of said first conductivity type,
   forming successively a first semiconductor layer (12) of said first conductivity type and a second semiconductor layer (13) of either conductivity type in regions including the inner portion of said groove and then forming a third semiconductor layer (14) of said second conductivity type on said second semiconductor layer and in regions inside and outside said groove, said third semiconductor layer being directly grown on said surface layer of the substrate and forming a p-n junction interface therein, and
   providing in said third semiconductor layer a concave interface with said substrate p-n-junction inside and outside the groove for diffusing the impurity of said first conductivity type from the side of the interface, inside and outside the groove, substrate into said third semiconductor layer so that p-n junction interfaces are moved by a heating process from the inner surfaces of said groove and from surfaces outside said groove to form said concave p-n junction in said third semiconductor layer.

* * * * *